United States Patent
Seddon

(10) Patent No.: US 10,818,551 B2
(45) Date of Patent: Oct. 27, 2020

(54) PLASMA DIE SINGULATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/243,353

(22) Filed: Jan. 9, 2019

(65) Prior Publication Data
US 2020/0219769 A1    Jul. 9, 2020

(51) Int. Cl.
| H01L 21/78 | (2006.01) |
| H01L 21/311 | (2006.01) |
| H01L 21/3213 | (2006.01) |
| H01L 21/3065 | (2006.01) |

(52) U.S. Cl.
CPC .......... *H01L 21/78* (2013.01); *H01L 21/3065* (2013.01); *H01L 21/311* (2013.01); *H01L 21/32131* (2013.01)

(58) Field of Classification Search
CPC . H01L 21/78; H01L 21/311; H01L 21/32131; H01L 21/782; H01L 21/784; H01L 21/786; H01L 21/3065–30655; H01L 21/31116; H01L 21/31122; H01L 21/31138; H01L 21/67069; H01L 21/32136–32137; H01L 21/02071; H01J 2237/334–3348
See application file for complete search history.

(56) References Cited

U.S. PATENT DOCUMENTS

| 4,820,377 A | 4/1989 | Davis et al. |
| 5,075,253 A | 12/1991 | Sliwa, Jr. |
| 5,166,097 A | 11/1992 | Tanielian |
| 5,510,655 A | 4/1996 | Tanielian |
| 5,753,418 A | 5/1998 | Tsai et al. |
| 5,856,705 A | 1/1999 | Ting |
| 5,863,813 A | 1/1999 | Dando |
| 6,030,885 A | 2/2000 | Bothra |
| 6,140,151 A | 10/2000 | Akram |
| 6,165,814 A | 12/2000 | Wark et al. |
| 6,200,851 B1 | 3/2001 | Arnold |
| 6,214,703 B1 | 4/2001 | Chen et al. |
| 6,342,724 B1 | 1/2002 | Wark et al. |
| 6,406,979 B2 | 6/2002 | Fischer et al. |

(Continued)

FOREIGN PATENT DOCUMENTS

| WO | 2001056063 A2 | 8/2001 |
| WO | 2001056063 A3 | 8/2001 |

(Continued)

*Primary Examiner* — Scott B Geyer
(74) *Attorney, Agent, or Firm* — Adam R. Stephenson, Ltd.

(57) ABSTRACT

Implementations of methods of singulating a plurality of die included in a substrate may include exposing a substrate material of a substrate in a die street through removing a metal layer in the die street coupled to the substrate, wherein only a portion of the substrate material in the die street is removed, and singulating a plurality of die included in the substrate through plasma etching the exposed substrate material of the substrate in the die street.

14 Claims, 3 Drawing Sheets

(56) References Cited

U.S. PATENT DOCUMENTS

| | | | |
|---|---|---|---|
| 6,528,864 B1 | 3/2003 | Arai | |
| 6,563,204 B1 | 5/2003 | Glenn | |
| 6,642,127 B2 | 11/2003 | Kumar et al. | |
| 6,686,225 B2 | 2/2004 | Wachtler | |
| 6,897,128 B2 | 5/2005 | Arita | |
| 6,969,669 B2 | 11/2005 | Arita | |
| 7,060,531 B2 | 6/2006 | Arita | |
| 7,098,077 B2 | 8/2006 | Huang et al. | |
| 7,129,114 B2 | 10/2006 | Akram | |
| 7,253,477 B2 | 8/2007 | Loechelt et al. | |
| 7,309,623 B2 | 12/2007 | Tan et al. | |
| 7,335,576 B2 | 2/2008 | David et al. | |
| 7,488,668 B2 | 2/2009 | Arita et al. | |
| 7,629,228 B2 | 12/2009 | Haji et al. | |
| 7,651,925 B2 | 1/2010 | Wyant | |
| 7,678,670 B2 | 3/2010 | Arita et al. | |
| 7,705,420 B2 | 4/2010 | Joodaki | |
| 7,767,551 B2 * | 8/2010 | Arita | H01L 21/78 438/460 |
| 7,767,554 B2 * | 8/2010 | Arita | H01L 21/3043 257/E21.238 |
| 7,846,848 B2 | 12/2010 | Lewington et al. | |
| 7,883,343 B1 | 2/2011 | Mulligan et al. | |
| 7,906,410 B2 | 3/2011 | Arita et al. | |
| 8,178,372 B2 | 5/2012 | Lutgen et al. | |
| 8,962,452 B2 | 2/2015 | Grivna | |
| 10,363,629 B2 * | 7/2019 | Lei | B23K 26/402 |
| 2003/0207579 A1 | 11/2003 | Rattner et al. | |
| 2004/0087065 A1 | 5/2004 | Udrea et al. | |
| 2004/0102025 A1 | 5/2004 | Arita | |
| 2004/0185580 A1 | 9/2004 | Goh | |
| 2005/0084996 A1 | 4/2005 | Harper | |
| 2005/0104165 A1 | 5/2005 | Ishio et al. | |
| 2005/0142863 A1 | 6/2005 | Spandre | |
| 2006/0001130 A1 | 1/2006 | Islam et al. | |
| 2006/0118515 A1 | 6/2006 | Dolechek et al. | |
| 2006/0154401 A1 | 7/2006 | Gardner et al. | |
| 2006/0205182 A1 * | 9/2006 | Soejima | H01L 21/78 438/460 |
| 2006/0244096 A1 | 11/2006 | Sekiya | |
| 2006/0278956 A1 | 12/2006 | Cadouri | |
| 2007/0087524 A1 | 4/2007 | Montgomery | |
| 2007/0132034 A1 | 6/2007 | Curello et al. | |
| 2007/0148807 A1 | 6/2007 | Akram | |
| 2007/0249178 A1 | 10/2007 | Ogihara | |
| 2008/0099900 A1 | 5/2008 | Oganesian et al. | |
| 2009/0001609 A1 | 1/2009 | Lim | |
| 2009/0057838 A1 | 3/2009 | Arita et al. | |
| 2009/0065904 A1 | 3/2009 | Wang | |
| 2009/0263927 A1 | 10/2009 | Lin et al. | |
| 2010/0048001 A1 | 2/2010 | Harikai et al. | |
| 2010/0055875 A1 | 3/2010 | Haji et al. | |
| 2010/0173474 A1 | 7/2010 | Arita et al. | |
| 2013/0059428 A1 * | 3/2013 | Arai | H01L 21/78 438/462 |
| 2013/0065378 A1 * | 3/2013 | Johnson | H01L 21/68 438/460 |
| 2014/0273401 A1 * | 9/2014 | Lei | H01L 21/3081 438/462 |
| 2015/0011073 A1 * | 1/2015 | Lei | H01L 21/67207 438/462 |
| 2016/0365283 A1 * | 12/2016 | Lei | H01L 21/02076 |
| 2018/0286758 A1 * | 10/2018 | Takenouchi | H01L 21/78 |
| 2018/0342422 A1 * | 11/2018 | Li | H01L 21/3065 |
| 2018/0342424 A1 * | 11/2018 | Okita | H01L 21/78 |
| 2018/0350615 A1 * | 12/2018 | Ansell | H01L 21/78 |
| 2019/0057891 A1 * | 2/2019 | Marinov | H01L 24/83 |
| 2019/0157100 A1 * | 5/2019 | Harikai | H01L 21/3081 |
| 2019/0279902 A1 * | 9/2019 | Park | H01L 21/2633 |

FOREIGN PATENT DOCUMENTS

| | | |
|---|---|---|
| WO | 2004066382 A1 | 8/2004 |
| WO | 2007007883 A1 | 1/2007 |
| WO | 2008023849 A1 | 2/2008 |
| WO | 2008081968 A1 | 7/2008 |
| WO | 2009063620 A1 | 5/2009 |

* cited by examiner

PLASMA DIE SINGULATION SYSTEMS AND RELATED METHODS

BACKGROUND

1. Technical Field

Aspects of this document relate generally to plasma die singulation systems and methods. More specific implementations involve methods of singulating semiconductor die from a substrate.

2. Background

Semiconductor devices include integrated circuits found in common electrical and electronic devices, such as phones, desktops, tablets, other computing devices, and other electronic devices. The devices are separated through singulating a wafer of semiconducting material into a plurality of semiconductor die. Singulation of the wafer is generally done with a saw. Upon singulation, the die can be mounted on a package and electrically integrated with the package which may then be used in the electrical or electronic device.

SUMMARY

Implementations of methods of singulating a plurality of die included in a substrate may include exposing a substrate material of a substrate in a die street through removing a metal layer in the die street coupled to the substrate, wherein only a portion of the substrate material in the die street is removed, and singulating a plurality of die included in the substrate through plasma etching the exposed substrate material of the substrate in the die street.

Implementations of methods of singulating a plurality of die included in a substrate may include one, all, or any of the following:

The substrate may be less than 50 micrometers thick.

The substrate may be less than 30 micrometers thick.

Removing the metal layer in the die street may further include removing through one of sawing, lasering, scribing, or jet ablating.

The portion of the substrate material in the die street and the metal layer may be removed simultaneously. The portion of the substrate material removed may extend between 5 to 15 micrometers into the substrate.

The methods of singulating a plurality of die included in a substrate may include removing damage from a sidewall of the die street through the plasma etching.

Exposing the substrate may further include removing a passivation layer coupled over the metal layer.

Singulating the plurality of die included in the substrate through plasma etching may further include removing a portion of the substrate material of the substrate having a width less than a width of the die street.

Implementations of methods of singulating a plurality of die included in a substrate may include exposing a substrate material of a substrate in a die street through removing a passivation layer in the die street coupled to the substrate, wherein only a portion of the substrate material in the die street is removed, and singulating a plurality of die included in the substrate through plasma etching the exposed substrate material of the substrate in the die street.

Implementations of methods of singulating a plurality of die included in a substrate may include one, all, or any of the following:

Removing the passivation layer in the die street may further include removing through one of sawing, lasering, scribing, or jet ablating.

The portion of the substrate material in the die street and the passivation layer may be removed simultaneously. The portion of the substrate material removed may extend between 5 to 15 micrometers into the substrate.

The methods of singulating a plurality of die included in a substrate may include removing damage from a sidewall of the die street through the plasma etching.

Implementations of methods of singulating a plurality of die included in a substrate may include exposing a substrate material of a substrate in a die street through removing a passivation layer and a metal layer in the die street coupled to the substrate, wherein only a portion of the substrate material in the die street is removed, and singulating a plurality of die included in the substrate through plasma etching the exposed substrate material of the substrate in the die street.

Implementations of methods of singulating a plurality of die included in a substrate may include one, all, or any of the following:

Removing the passivation layer and the metal layer in the die street may further include removing through one of sawing, lasering, scribing, or jet ablating.

Singulating the plurality of die included in the substrate through plasma etching may further include removing a portion of the substrate material of the substrate having a width less than a width of the die street.

The methods of singulating a plurality of die included in a substrate may include removing damage from a sidewall of the die street through the plasma etching.

The portion of the substrate material in the die street, the passivation layer, and the metal layer may be removed simultaneously. The portion of the substrate material removed may extend between 5 to 15 micrometers into the substrate.

The portion of the substrate material in the die street, the passivation layer, and the metal layer may be removed simultaneously. The portion of the substrate material removed may extend more than 15 micrometers into the substrate.

The substrate may be less than 50 micrometers thick.

The substrate may be less than 30 micrometers thick.

Exposing the substrate may further include removing a passivation layer coupled over the metal layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended plasma die singulation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such plasma die singulation systems and related methods, and implementing components and methods, consistent with the intended operation and methods.

Figure 1:
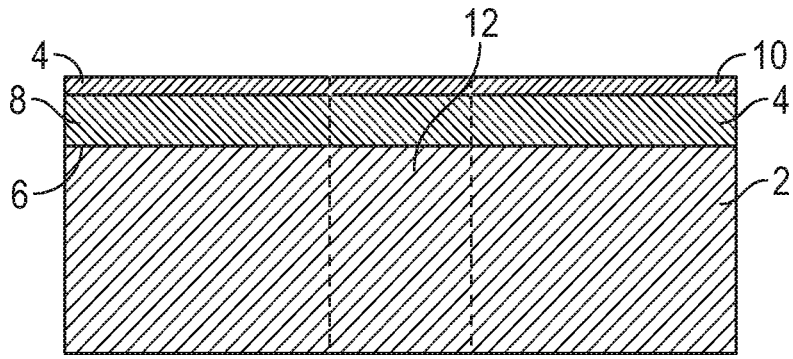
FIG. 1 is a cross sectional side view of a substrate coupled to a plurality of layers.

Referring to FIG. 1, a cross sectional side view of a substrate 2 coupled to a plurality of layers 4 is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon on insulator, silicon carbide, polycrystalline or amorphous forms of any of the foregoing, and any other substrate material useful for constructing semiconductor devices. In particular implementations, the substrate may be a silicon-on-insulator substrate.

In various implementations, the substrate 2 is thinned. In particular implementations, the substrate 2 may be less than 30 micrometers (um) thick, less than 50 um thick, and/or less than 100 um thick. In other implementations, the substrate may be more than 100 um thick and/or may not be thinned.

In various implementations, a first side 6 of the substrate 2 may be coupled to a metal layer 8 of the plurality of layers 4. The metal layer may include, by non-limiting example, copper, aluminum, nickel, any other metal, any alloy thereof, and any combination thereof. In various implementations, the substrate 2 may be directly coupled to the metal layer 8. In other implementations (though not illustrated), other layers, such as a metal seed layer, may be coupled between the metal layer 8 and the substrate 2. In still other implementations, rather than a plurality of layers, the metal layer may be the only layer coupled over the substrate 2.

Still referring to FIG. 1, a passivation layer 10 may be included in the plurality of layers 4. In various implementations the passivation material 10 may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. Because of this, the term "passivation material" and "passivation layer," as used herein, includes any of the aforementioned materials whether the material was deposited to act as a passivating material or whether the material merely forms a non-plasma etchable portion or layer in the die street region. The passivation layer 10 may be coupled over the metal layer 8. The passivation layer may include, by non-limiting example, a metal oxide, silicon dioxide, silicon nitride, polyimide, a polymer material, or any other passivation layer material type. In various implementations, multiple layers of passivating materials may be included in the plurality of layers 4. In other implementations, the passivation layer may be the only layer in the plurality of layers. While the implementation illustrated by FIG. 1 includes two layers, the metal layer 8 and the passivation layer 10 coupled over the substrate 2, other implementations may include additional metal layers, additional passivation layers, additional other layers, layers without the metal layer 8, layers without the passivation layer 10, and any combination thereof. The layers may fully cover the substrate 2 or may only partially cover the substrate.

While the methods disclosed herein are focused on singulating the substrate 2, it is understood that the substrate 2 may include and/or be coupled to other elements not illustrated, such as a plurality of semiconductor devices. In such implementations, the plurality of semiconductor devices may include a power device or non-power semiconductor device. In implementations where a plurality of power devices are coupled to the substrate, the power devices may include, by non-limiting example, a metal oxide field effect transistor (MOSFET), an insulated gate bipolar transistor (IGBT), a diode, a thyristor, a silicon controlled rectifier (SCR), or any other kind of power semiconductor device.

The substrate 2 and the plurality of layers 4 include a die street 12 therethrough. As illustrated by FIG. 1, the metal layer 8 and the passivation layer 10 extend through the die street 12. In various implementations, electrical testing devices and corresponding probe pads providing access to the electrical testing devices and structures may be included in at least one of the plurality of layers 4 and in the die street 12.

Figure 2:
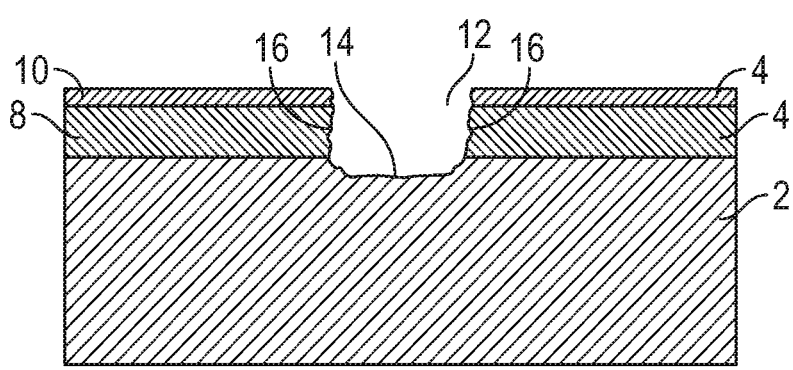
FIG. 2 is the cross sectional side view of the substrate of FIG. 1 with the plurality of layers in the die street removed.

Referring to FIG. 2, the cross sectional side view of the substrate of FIG. 1 with the plurality of layers in the die street removed is illustrated. As used herein, when "removal" of a layer in a die street is discussed, it is understood that this also includes removal of the portion of the layer in the die street and does not require removal of the entire layer. In various implementations, a method of singulating a plurality of die included in a substrate includes exposing a substrate material of the substrate 2 in the die street 12 through removing the plurality of layers 4 in the die street 12 coupled to the substrate 2. In implementations having only a metal layer rather than a plurality of layers, the method may include removing the metal layer in the die street 12. Similarly, in implementations having only a passivation layer (or some other layer) rather than the plurality of layers, the method includes removing the passivation layer (or some other layer) in the die street 12. As illustrated by FIG. 2, the method may also include removing a portion of the substrate material in the die street at substantially the same time the metal layer 8 and/or passivation layer 10 in the die street are removed. In various implementations, the portion of the substrate material may be removed substantially simultaneously with the removal of the metal layer and/or passivation layer as it is removed in the same cut or during the same removal process. The portion of the substrate material is not removed completely simultaneously with the metal layer and/or passivation layer as the cutting mechanism, such as a saw blade, must remove the outer layers coupled over the substrate before the substrate material is removed.

As discussed further herein, the amount of the substrate material removed from the die street at the same time as the metal layer and/or passivation layer are removed from the die street may vary. Though the amounts may vary, in the various implementations disclosed herein, enough of the substrate material is removed in order to clear away any of the passivation layer or metal layer that may have migrated into/been formed into the substrate while removing the metal layer and/or the passivation layer from the die street. In this manner, the material of the substrate in the die street is exposed. In various implementations, removal of the metal layer and/or passivation layer is necessary to allow for singulation of the substrate through plasma etch. In various implementations, the metal layer, passivation layer, any other layer coupled over the substrate, and the removed portion of the substrate may be removed through, by non-limiting example, sawing, lasering, scribing, or jet ablating. In various implementations, the exposed surface of the substrate in the die street may be sloped. This may be a result of the method used to form the kerf, such as using a chamfered saw blade. Similarly, in various implementations the width of the kerf, or the removed portion of the metal layer 8 and/or passivation layer 10 in the die street 12, may vary based upon the specific method used to form the kerf. Further, the sidewalls of the kerf, or the sidewalls 16 of the die street 12, may include damage. Using a saw, laser, water jet, or scribe to remove the portion of the substrate results in the production of chips and cracks in the sidewalls 16 of the die street and layers adjacent to the die street. The presence of the cracks and chips has the potential to compromise the reliability of the resulting semiconductor package (and reduce the die strength) if/when the cracks and chips propagate into the device portion of the semiconductor die. Since the saw (or other) process involves the rubbing of the rotating blade against the die surface, the chipping and cracking can only be managed through saw (or other) processing variables (substrate feed speed, blade kerf width, cut depth, multiple saw cuts, blade materials, etc.) but not eliminated.

Figure 3:
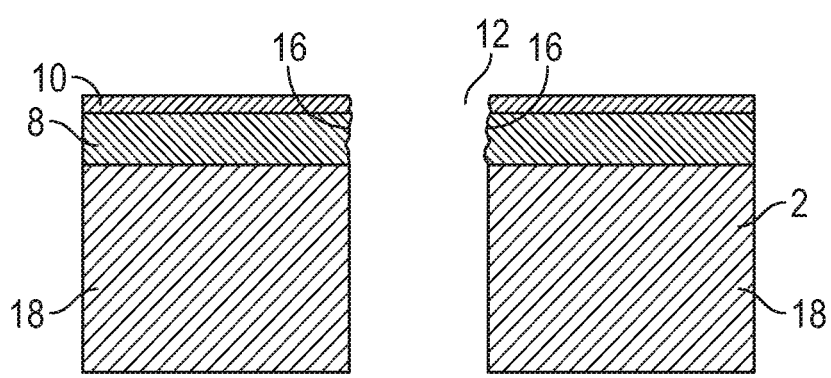
FIG. 3 is a cross sectional side view of the substrate of FIG. 1 singulated into semiconductor die.

Referring to FIG. 3, a cross sectional side view of the substrate of FIG. 1 singulated into semiconductor die is illustrated. In various implementations, the method of singulating a plurality of die included in a substrate includes singulating a plurality of die 18 included in the substrate 2 through plasma etching the exposed substrate material of the substrate in the die street 12. In various implementations, a plasma etch process marketed under the tradename BOSCH® by Robert Bosch GmbH, Stuttgart Germany (the "Bosch process"), may be used to singulate the substrate 2 into a plurality of die 18. In other implementations, other plasma etch processes may be used to singulate the plurality of die 18 from the substrate 2. In various implementations, though not illustrated, singulating the plurality of die included in the substrate through plasma etching may include removing a portion of the substrate material of the substrate having a width less than a width of the die street.

In such implementations, the width of the removed portion from plasma etching is less than the width of the die street as plasma die singulation is capable of creating a die street more narrow than the die street created through sawing, lasering, scribing, or jet ablating. In other implementations, and as illustrated by FIG. 3, the width of the portion of the removed substrate material may be the same or substantially the same as the width of the die street 12 by singulating the plurality of die 18 through removing through plasma etch all of the substrate material of the substrate 2 in the die street 12.

Still referring to FIG. 3, in various implementations the method of singulating a plurality of die included in a substrate may include healing, or removing damage from, a sidewall of the die street 12 through plasma etching. In such implementations, the plasma (which may include charged ions) may penetrate the cracks and/or chips in the sidewalls 16 of the die street 12 within the substrate 2 formed when the metal layer 8 and/or passivation layer 10 were removed. The plasma may also penetrate/facilitate reaction with the materials of the cracks and/or chips of the sidewalls of the die street or removed portion of the substrate 2 formed when the metal layer 8 and/or passivation layer 10 were removed. As the plasma enters the cracks and/or chips, the damaged portion of the substrate may etch away and result in smoothed, or healed, sidewalls 16 of the substrate material (as illustrated by FIG. 3). In various implementations, the sidewalls 16 of the die street 12 may be healed through the same plasma etch used to singulate the plurality of die 18 from the substrate 2. In other implementations, the sidewalls 16 of the die street 12 may be healed through a separate plasma etch from the plasma etch used to singulate the plurality of die 18 from the substrate 2. In various implementations, this second plasma etch may be more isotropic than the plasma etch used to singulate the plurality of die.

Figure 4:
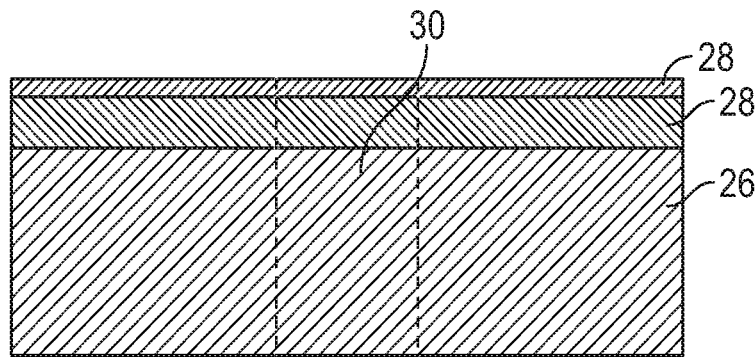
FIG. 4 is a cross sectional side view of a substrate coupled to a plurality of layers.
Figure 5:
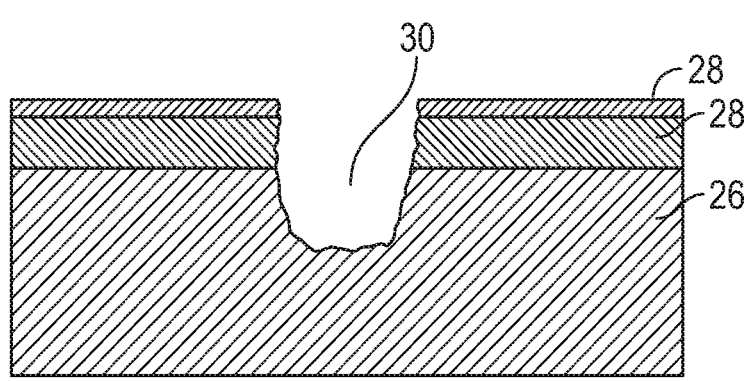
FIG. 5 is the cross sectional side view of the substrate of FIG. 4 with the plurality of layers in the die street removed.
Figure 6:
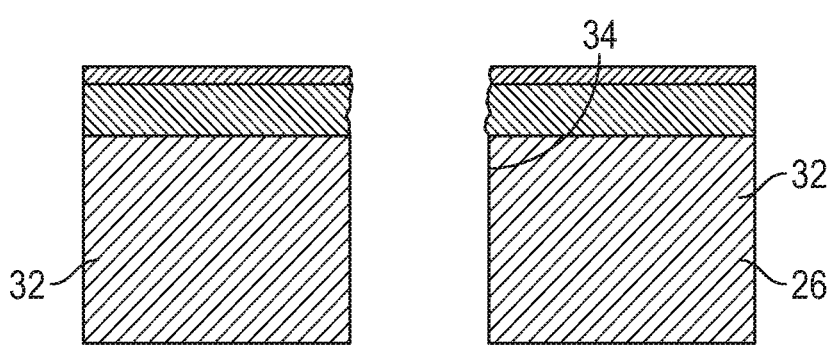
FIG. 6 is a cross sectional side view of the substrate of FIG. 4 singulated into semiconductor die.

Referring to FIGS. 4-6, a method of singulating a plurality of die from a substrate similar to the method of FIGS. 1-3 is illustrated. Referring to FIG. 4, a cross sectional side view of a substrate 26 coupled to one or more layers 28 is illustrated. The substrate 26 may be the same as or similar to any substrate disclosed herein and the one or more layers 28 may include any type of layer disclosed herein. Referring to FIG. 5, the cross sectional side view of the substrate of FIG. 4 with the plurality of layers in the die street removed is illustrated. Similar to the method illustrated by FIG. 2, the method for singulating a plurality of die included in a substrate includes exposing a substrate material of a substrate 26 in a die street 30 through removing the one or more layers 28 in the die street 30 coupled to the substrate 26. A portion of the substrate 26 in the die street is substantially simultaneously removed with the portion of the one or more layers 28 in the die street 30. The portion of the substrate 26 and the one or more layers 28 in the die street 30 may be removed through, by non-limiting example, sawing, lasering, jet ablating, or scribing. The difference between the method illustrated by FIG. 5 and the method illustrated by FIG. 2 is that the method illustrated by FIG. 5 includes removing a greater portion of the substrate 26 when removing the one or more layers 28 in the die street 30. In various implementations, the portion of the substrate material removed from the substrate 26 in the die street 30 extends about 5 microns to about 15 microns into the substrate. In other implementations, the portion of the substrate 26 removed from the die street 30 may extend into the substrate 26 less than 5 um or more than 15 um.

Referring to FIG. 6, a cross sectional side view of the substrate of FIG. 4 singulated into semiconductor die is illustrated. The method for singulating a plurality of die 32 included in the substrate 26 may include singulating the plurality of die 32 using any method disclosed herein. As illustrated by FIG. 6, the sidewalls 34 of the die street 30 formed when removing the portion of the substrate 26 may be healed through either the same plasma etch used to singulate the plurality of die 32 or through a separate plasma etch. In implementations having a thick substrate, the method of singulating the plurality of die may include removing a greater portion of the substrate in the die street in order to require plasma etching through less substrate.

Figure 7:
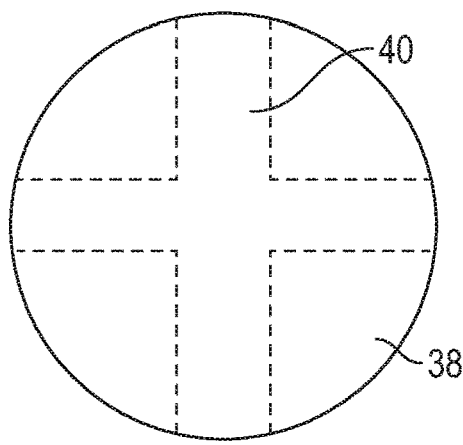
FIG. 7 is a top view of a substrate having one or more layers coupled over the substrate.
Figure 8:
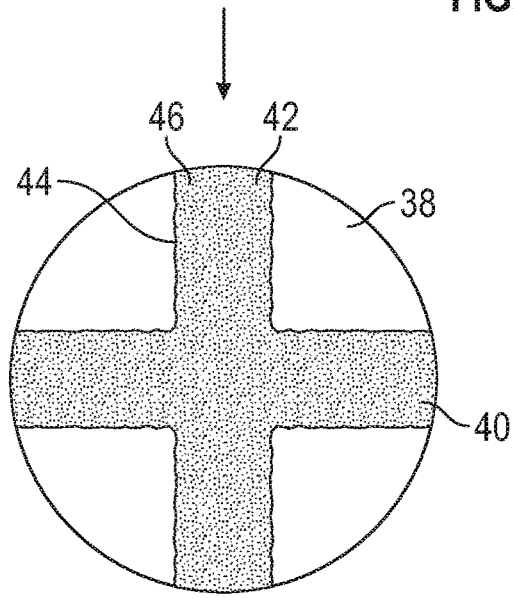
FIG. 8 is the top view of the substrate of FIG. 7 with the material of the one or more layers in the die street removed.
Figure 9:
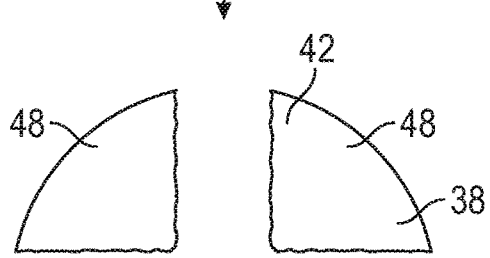
FIG. 9 is a top view of the substrate of FIG. 7 singulated into semiconductor die.
Figure 9:
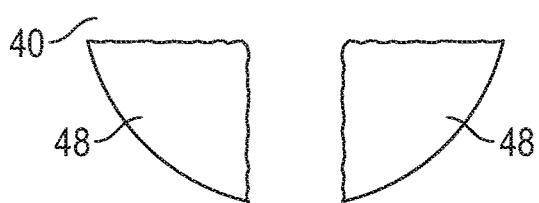

Referring to FIGS. 7-9, a top view of a method of singulating a plurality of die from a substrate similar to or the same as the methods illustrated by FIGS. 1-6 is illustrated. Referring specifically to FIG. 7, a top view of a portion of a substrate having one or more layers 38 coupled over the substrate is illustrated. The portion of the substrate illustrated includes intersecting die streets 40. The substrate may be any type of substrate disclosed herein and the one or more layers may include any type of layer disclosed herein. Referring to FIG. 8, a top view of the substrate of FIG. 7 with the material of the one or more layers 38 in the die street 40 removed is illustrated. The method for singulating a plurality of die included in a substrate 42 includes exposing a substrate material of a substrate 42 in a die street 40 through removing the one or more layers 38 in the die street 40 coupled to the substrate 42. A portion of the substrate 42 in the die street 40 is substantially simultaneously removed with the portion of the one or more layers 38 in the die street 40. The portion of the substrate 42 and the one or more layers 38 in the die street 40 may be removed through, by non-limiting example, sawing, lasering, jet ablating, or scribing. As illustrated by FIG. 8, the sidewalls 44 of the die street 40 along with the base 46 of the kerf may be damaged and/or rough.

Referring to FIG. 9, a top view of the substrate 42 of FIG. 7 singulated into semiconductor die 48 is illustrated. As illustrated by FIG. 9, the method includes singulating a plurality of die 48 from the substrate 42. Any method disclosed herein may be used to singulate the plurality of die 48. In implementations through which the plurality of die 48 are singulated through a plasma etch, the plasma etch may heal the damage to the sidewalls of the die streets 40 in the substrate 42. As previously disclosed herein, the width of the portion of the substrate 42 removed through the plasma etch may be less than the width of the die street 40.

The plurality of die singulated from the substrates disclosed herein may include any type of semiconductor die including any type disclosed herein. By singulating the plurality of die through plasma etching, the reliability of the plurality of die may be improved as less damage is induced into the die as compared to singulating the plurality of die through sawing, lasering, or other singulation methods. Further, the die may be strengthened as the plasma etch may heal the damaged portions of the substrate removed when the portion of the substrate was removed with the metal layer and/or passivation layer through the saw, laser, scribe, or jet. The improved reliability and strength of the die may be especially important when the die are coupled to power semiconductor devices. Power semiconductor devices, such as an IGBT, may be coupled to a large lead frame and may include a large heat sink. The larger components of the semiconductor package may result in additional strain to the semiconductor die which may result in failure of the die (and especially of thinned die) if not sufficiently strong. The various methods disclosed herein may also permit the width of the die streets to be thinner/narrower than usual as a sawing or laser ablation process is not required to completely singulate the streets.

The methods of singulating a plurality of die disclosed herein may be utilized with thinned (or non-thinned) substrates having one or more layers coupled thereto in a variety of designs. Because the substrate must be exposed in order for plasma singulation to occur, the method of removing the layers coupled over the substrate as disclosed herein is advantageous as these methods can allow for plasma die singulation of any thinned substrate rather than requiring plasma die singulation of a specifically designed substrate with a certain passivation or metal layer configuration which does not include the passivation layer, metal layer, or other layer coupled over the substrate in the die street. Further, because the metal layer, passivation layer, and/or other layer are coupled over the substrate in the die streets, the test structures/devices, alignment features, and probe pads may be included within the portions of the metal (or other) layers coupled over the substrate. Because the test structures/devices, alignment features, and probe pads may be included within the die street (and later destroyed through removing the metal layer in the die street), the methods disclosed herein may eliminate the need for drop out dies within the substrate which are specifically placed and used to contain all the test structures/devices, alignment features, and probe pads used to manufacture and test the devices formed on the substrate. Further, by not needing drop out dies, the substrate may be singulated into a greater number of die and there will be no drop out die to interfere with the process of picking and sorting the die following singulation. In various implementations, drop out die are larger than neighboring good die and they may interfere with the uniform stretch of the picking tape. Specifically, in such implementations including drop out die, the tape may be stretched different amounts when the die sizes are different, thus interfering with the alignment of the die, and in turn, the reliability of the die picking and sorting process.

In places where the description above refers to particular implementations of plasma die singulation systems and related methods and implementing components, sub-components, methods and sub-methods, it should be readily apparent that a number of modifications may be made without departing from the spirit thereof and that these implementations, implementing components, sub-components, methods and sub-methods may be applied to other plasma die singulation systems and related methods.

What is claimed is:

1. A method of singulating a plurality of die comprised in a substrate, the method comprising:
   exposing a substrate material of a substrate in a die street through removing a metal layer in the die street coupled to the substrate, wherein only a portion of the substrate material in the die street is removed; and
   singulating a plurality of die comprised in the substrate through plasma etching the exposed substrate material of the substrate in the die street;
   wherein the substrate is less than 50 micrometers thick;
   wherein the portion of the substrate material in the die street and the metal layer are removed substantially simultaneously; and
   wherein the portion of the substrate material removed extends between 5 to 15 micrometers into the substrate.

2. The method of claim 1, wherein the substrate is less than 30 micrometers thick.

3. The method of claim 1, wherein removing the metal layer in the die street further comprises removing through one of sawing, lasering, scribing, or jet ablating.

4. The method of claim 1, further comprising removing damage from a sidewall of the die street through the plasma etching.

5. The method of claim 1, wherein exposing the substrate further comprises removing a passivation layer coupled over the metal layer.

6. The method of claim 1, wherein singulating the plurality of die comprised in the substrate through plasma etching further comprises removing a portion of the substrate material of the substrate having a width less than a width of the die street.

7. A method of singulating a plurality of die comprised in a substrate, the method comprising:
   exposing a substrate material of a substrate in a die street through removing a passivation layer in the die street coupled to the substrate, wherein only a portion of the substrate material in the die street is removed; and
   singulating a plurality of die comprised in the substrate through plasma etching the exposed substrate material of the substrate in the die street;
   wherein the substrate is less than 50 micrometers thick;
   wherein the portion of the substrate material in the die street, the passivation layer, and a metal layer are removed substantially simultaneously; and
   wherein the portion of the substrate material removed extends between 5 to 15 micrometers into the substrate.

8. The method of claim 7, wherein removing a metal layer in the die street further comprises removing through one of sawing, lasering, scribing, or jet ablating.

9. The method of claim 7, further comprising removing damage from a sidewall of the die street through the plasma etching.

10. A method of singulating a plurality of die comprised in a substrate, the method comprising:
    exposing a substrate material of a substrate in a die street through removing a passivation layer and a metal layer in the die street coupled to the substrate, wherein only a portion of the substrate material in the die street is removed; and
    singulating a plurality of die comprised in the substrate through plasma etching the exposed substrate material of the substrate in the die street;
    wherein the substrate is less than 50 micrometers thick;
    wherein the portion of the substrate material in the die street, the passivation layer, and the metal layer are removed substantially simultaneously; and
    wherein the portion of the substrate material removed extends between 5 to 15 micrometers into the substrate.

11. The method of claim 10, wherein removing the passivation layer and the metal layer in the die street further comprises removing through one of sawing, lasering, scribing, or jet ablating.

12. The method of claim 10, wherein singulating the plurality of die comprised in the substrate through plasma etching further comprises removing a portion of the substrate material of the substrate having a width less than a width of the die street.

13. The method of claim 10, further comprising removing damage from a sidewall of the die street through the plasma etching.

14. The method of claim 10, wherein the substrate is less than 30 micrometers thick.

\* \* \* \* \*